United States Patent
Kim

(10) Patent No.: US 9,404,626 B2
(45) Date of Patent: Aug. 2, 2016

(54) ILLUMINATING APPARATUS

(71) Applicant: LG Innotek Co., Ltd., Seoul (KR)

(72) Inventor: Eun Hwa Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/189,233

(22) Filed: Feb. 25, 2014

(65) Prior Publication Data

US 2014/0240978 A1    Aug. 28, 2014

(30) Foreign Application Priority Data

Feb. 28, 2013    (KR) ........................ 10-2013-0022088

(51) Int. Cl.
| | |
|---|---|
| *F21S 4/00* | (2016.01) |
| *F21K 99/00* | (2016.01) |
| *G06F 3/041* | (2006.01) |
| *G02F 1/1335* | (2006.01) |
| *F21V 15/01* | (2006.01) |
| *F21S 8/04* | (2006.01) |
| *F21Y 101/02* | (2006.01) |
| *F21Y 105/00* | (2016.01) |

(52) U.S. Cl.
CPC ... *F21K 9/54* (2013.01); *F21K 9/50* (2013.01); *F21K 9/52* (2013.01); *F21S 4/20* (2016.01); *F21S 8/04* (2013.01); *F21V 15/01* (2013.01); *G02F 1/133603* (2013.01); *G02F 1/133608* (2013.01); *G02F 1/133611* (2013.01); *G06F 3/0416* (2013.01); *F21Y 2101/02* (2013.01); *F21Y 2105/003* (2013.01); *H01L 2224/48091* (2013.01); *H01L 2924/181* (2013.01)

(58) Field of Classification Search
CPC ............... F21K 9/52; F21K 9/54; F21K 9/50; G02F 1/133603; G02F 1/133608; G02F 1/133611; F21S 4/20; F21S 8/04; F21Y 2105/003; H01L 2924/181; H01L 2224/48091; F21V 15/01; G06F 3/0416
USPC ........................................... 362/249.06, 97.3
See application file for complete search history.

(56) References Cited

U.S. PATENT DOCUMENTS

| 4,254,453 | A | * | 3/1981 | Mouyard et al. ............... 362/240 |
| 5,924,785 | A | * | 7/1999 | Zhang et al. .................. 362/241 |

(Continued)

FOREIGN PATENT DOCUMENTS

| JP | 2011-222182 A | 11/2011 |
| WO | WO 2006/005976 A1 | 1/2006 |

OTHER PUBLICATIONS

European Search Report dated May 8, 2014, issued in Application No. 14156408.8.

*Primary Examiner* — Robert May
*Assistant Examiner* — Bryon T Gyllstrom
(74) *Attorney, Agent, or Firm* — Ked & Associates, LLP

(57) ABSTRACT

Disclosed is an illuminating apparatus including a housing including a lower plate and a side plate and a light emitting module including a substrate disposed on the lower plate and a plurality of light sources disposed on the substrate to be spaced apart from each other, wherein a height of the side plate is determined as a value obtained by dividing a separation distance between adjacent ones of the light sources by a value obtained by multiplying a tangent value of a max intensity angle of each of the light sources by a luminance compensation factor.

20 Claims, 9 Drawing Sheets

(56) References Cited

U.S. PATENT DOCUMENTS

| | | | |
|---|---|---|---|
| 6,375,340 B1* | 4/2002 | Biebl et al. | 362/294 |
| 7,946,724 B2* | 5/2011 | Shin et al. | 362/97.3 |
| 7,993,022 B2* | 8/2011 | Bertram | 362/97.3 |
| 2003/0026096 A1* | 2/2003 | Ellens | G02F 1/133603 362/231 |
| 2006/0139932 A1* | 6/2006 | Park | F21K 9/00 362/294 |
| 2008/0211989 A1* | 9/2008 | Park | 349/64 |
| 2008/0239751 A1* | 10/2008 | Chang | F21V 13/10 362/612 |
| 2008/0259609 A1* | 10/2008 | Chang | G02F 1/133603 362/307 |
| 2009/0273920 A1* | 11/2009 | Song et al. | 362/97.1 |
| 2009/0316386 A1* | 12/2009 | Yun | G02F 1/133603 362/97.1 |
| 2011/0205734 A1* | 8/2011 | Yamakita | G02F 1/133606 362/235 |
| 2011/0222293 A1 | 9/2011 | Kim et al. | 362/294 |
| 2012/0182739 A1* | 7/2012 | Leung | F21S 2/005 362/249.06 |
| 2012/0218752 A1* | 8/2012 | Sumitani | F21K 9/54 362/235 |

* cited by examiner

| Rectangle T [ Based on width length of 600 mm (θ=70°) ] | | | | | | | Luminance Simulation Results | | | | |
|---|---|---|---|---|---|---|---|---|---|---|---|
| Number of LEDs | | | Pitch (mm) | | T | | | | | | |
| Total | Width (Q) | Height | Width | Height | A=1.4 | A=1.0 | Factor A | Min | Max | Avg | Min / Max | Min / Avg |
| 16 | 16 | 1 | 38 | 38 | 10 | 14 | 1.4 | 16383.80 | 21163.84 | 19321.65 | 0.77 | 0.85 |
| | | | | | | | 1 | 16270.58 | 20669.26 | 19034.58 | 0.79 | 0.85 |
| 12 | 12 | 1 | 50 | 50 | 13 | 18 | 1.4 | 8425.74 | 11580.14 | 10629.12 | 0.73 | 0.79 |
| | | | | | | | 1 | 8380.04 | 11505.35 | 10564.68 | 0.73 | 0.79 |
| 9 | 9 | 1 | 67 | 67 | 17 | 24 | 1.4 | 5206.03 | 6605.45 | 6167.05 | 0.79 | 0.84 |
| | | | | | | | 1 | 5151.74 | 6626.71 | 6121.74 | 0.78 | 0.84 |
| 6 | 6 | 1 | 100 | 100 | 26 | 36 | 1.4 | 2401.85 | 3104.26 | 2851.85 | 0.77 | 0.84 |
| | | | | | | | 1 | 2417.95 | 3136.55 | 2819.68 | 0.77 | 0.86 |
| 4 | 4 | 1 | 150 | 150 | 39 | 55 | 1.4 | 1141.97 | 1424.74 | 1293.24 | 0.80 | 0.88 |
| | | | | | | | 1 | 1102.61 | 1439.58 | 1273.84 | 0.77 | 0.87 |
| 2 | 2 | 1 | 300 | 300 | 78 | 109 | 1.4 | 292.28 | 378.44 | 326.96 | 0.77 | 0.89 |
| | | | | | | | 1 | 277.08 | 371.77 | 320.83 | 0.75 | 0.86 |

| Square T [ Based on width and height lengths of 300 mm (θ=70°) ] | | | | | | Luminance Simulation Results | | | | | |
|---|---|---|---|---|---|---|---|---|---|---|---|
| Number of LEDs | | Pitch (mm) | | T | | | | | | | |
| Total | Width (m) | Height (n) | Width (P1) | Height (P2) | A=1.4 | A=1.0 | Factor A | Min | Max | Avg | Min / Max | Min / Avg |
| 16 | 4 | 4 | 75 | 75 | 19 | 27 | 1.4 | 4429.68 | 6106.25 | 5368.58 | 0.73 | 0.83 |
|  |  |  |  |  |  |  | 1 | 4511.43 | 6163.99 | 5327.96 | 0.73 | 0.85 |
| 12 | 3 | 4 | 100 | 75 | 26 | 36 | 1.4 | 3406.14 | 4665.79 | 3996.87 | 0.73 | 0.85 |
|  |  |  |  |  |  |  | 1 | 3468.74 | 4494.41 | 3962.99 | 0.77 | 0.88 |
| 9 | 3 | 3 | 100 | 100 | 26 | 36 | 1.4 | 2556.90 | 3413.09 | 2995.85 | 0.75 | 0.85 |
|  |  |  |  |  |  |  | 1 | 2490.91 | 3422.42 | 2969.61 | 0.73 | 0.84 |
| 6 | 2 | 3 | 150 | 100 | 39 | 55 | 1.4 | 1726.70 | 2312.12 | 1977.04 | 0.75 | 0.87 |
|  |  |  |  |  |  |  | 1 | 1676.58 | 2265.62 | 1950.73 | 0.74 | 0.86 |
| 4 | 2 | 2 | 150 | 150 | 39 | 55 | 1.4 | 1130.53 | 1534.44 | 1316.89 | 0.74 | 0.86 |
|  |  |  |  |  |  |  | 1 | 1076.28 | 1535.14 | 1299.50 | 0.70 | 0.83 |
| 2 | 1 | 2 | 300 | 150 | 78 | 109 | 1.4 | 568.55 | 770.63 | 642.05 | 0.74 | 0.89 |
|  |  |  |  |  |  |  | 1 | 540.56 | 709.21 | 627.04 | 0.76 | 0.86 |

ILLUMINATING APPARATUS

CROSS REFERENCE TO RELATED APPLICATION

This application claims priority under 35 U.S.C. §119 to Korean Patent Application No. 10-2013-0022088, filed in Korea on Feb. 28, 2013, whose entire disclosure is hereby incorporated by reference.

BACKGROUND

1. Field

Embodiments relate to an illuminating apparatus.

2. Background

Fluorescent lamps are generally used as illuminating lamps. Fluorescent lamps have a frequency of 60 Hz and thus may cause a user to feel tired of eyes when used for an extended period of time due to flickering.

In addition, when used for long period of time, fluorescent lamps themselves release heat and thus may increase ambient temperature, which results in high power consumption.

As compared to fluorescent lamps, light emitting diode (LED) luminaires have high conversion efficiency from electric power to light, high-efficiency luminous intensity even at a low voltage, no glare, and high stability and thus are increasingly used widely as luminaires.

In lighting apparatuses for illumination, a light emitting module in which a plurality of LEDs is disposed is used as a light source. In this regard, uniform luminance needs to be maintained to eliminate eye fatigue of a user.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

Figure 1:
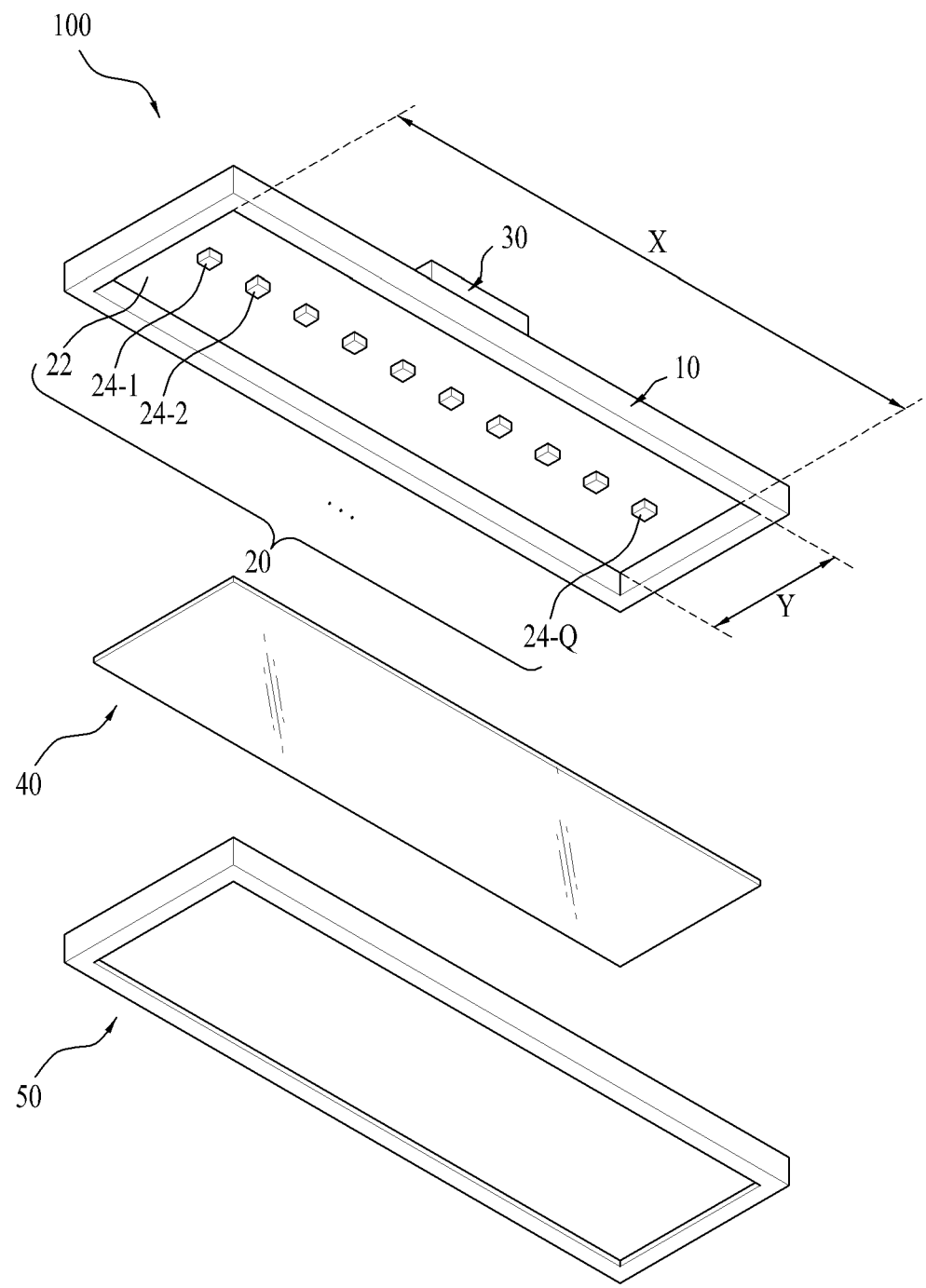
FIG. 1 is a view of an illuminating apparatus according to an embodiment.

Hereinafter, embodiments will be described with reference to the annexed drawings and examples. It will be understood that when an element is referred to as being "on" or "under" another element, it can be directly on/under the element, and one or more intervening elements may also be present. When an element is referred to as being "on" or "under", "under the element" as well as "on the element" can be included based on the element.

In the drawings, the size of each element may be exaggerated, omitted, or schematically illustrated for convenience and clarity of explanation. In addition, the size of each element does not wholly reflect an actual size thereof. In addition, like reference numerals denote like elements throughout the drawings. Hereinafter, an illuminating apparatus according to an embodiment will be described with reference to the accompanying drawings.

Figure 2:
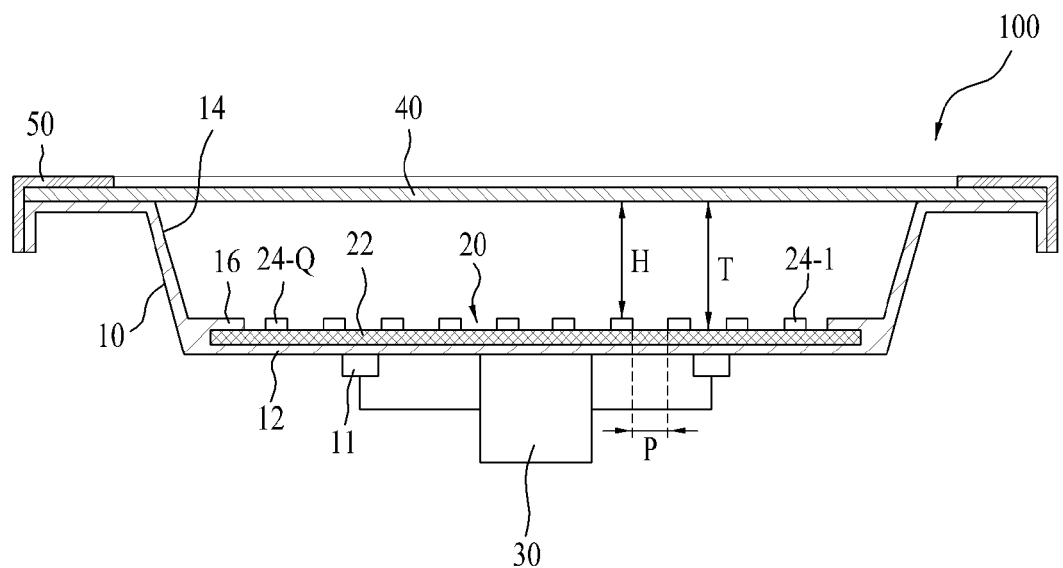
FIG. 2 is a sectional view of the illuminating apparatus of FIG. 1.

FIG. 1 is a view of an illuminating apparatus 100 according to an embodiment. FIG. 2 is a sectional view of the illuminating apparatus 100 of FIG. 1.

Referring to FIGS. 1 and 2, the illuminating apparatus 100 includes a housing 10, a light emitting module 20, a power supply 30, a diffuser plate 40, and a fixing member 50.

The housing 10 may accommodate the light emitting module 20 and reflect light emitted from the light emitting module 20.

The housing 10 may include a lower plate 12 on which the light emitting module 20 is disposed and a side plate 14 to surround the light emitting module 20. The side plate 14 may be connected to edges of the lower plate 12 and inclined at a constant angle with respect to the lower plate 12.

The side plate 14 may include first and second side surfaces 14-1 and 14-2 facing each other and third and fourth side surfaces 14-3 and 14-4 facing each other. The lengths of the first and second surfaces 14-1 and 14-2 may be smaller than those of the third and fourth side surfaces 14-3 and 14-4.

The first side surface 14-1 may have the same length as that of the second side surface 14-2, and the third side surface 14-3 may have the same length as that of the fourth side surface 14-4.

A top view of the housing 10 may have a rectangular shape in which a width length X is greater than a height length Y. For example, the lower plate 12 of the housing 10 may have a rectangular shape in which the width length X is greater than the height length Y. In another embodiment, the side plate 14 of the housing 10 may have a rectangular shape in which the width length X is greater than the height length Y.

An angle between the lower and side plates 12 and 14 of the housing 10 may be 90° to less than 180°. For example, a vertical section of the housing 10 may have a rectangular, square or trapezoidal shape.

The light emitting module 20 may include a substrate disposed on the lower plate 12 of the housing 10 and a plurality of light sources 24-1 to 24-Q where Q>1 (Q being a natural number) disposed on the substrate 22 to be spaced apart from each other.

The substrate 22 may be a printed circuit board (PCB), and the light sources 24-1 to 24-Q where Q>1 (Q being a natural number) may be light emitting diodes (LEDs), but embodiments of the disclosure are not limited thereto.

The light sources 24-1 to 24-Q where Q>1 (Q being a natural number) may be disposed on the substrate 22 in a row or in a matrix form. FIG. 1 illustrates the light sources 24-1 to 24-Q where Q>1 (Q being a natural number) as being disposed in a row. In another embodiment, however, the light sources 24-1 to 24-Q where Q>1 (Q being a natural number) may be disposed in the form of a matrix including a plurality of columns×a plurality of rows.

The substrate 22 may include a wiring pattern to supply power and transmit a control signal. A groove part 16 into which the substrate 22 of the light emitting module 22 is inserted may be disposed at a contact region between the lower and side plates 12 and 14 of the housing 10. The substrate 22 may be fixed to the housing 10 by being inserted into the groove part 16.

Figure 10:
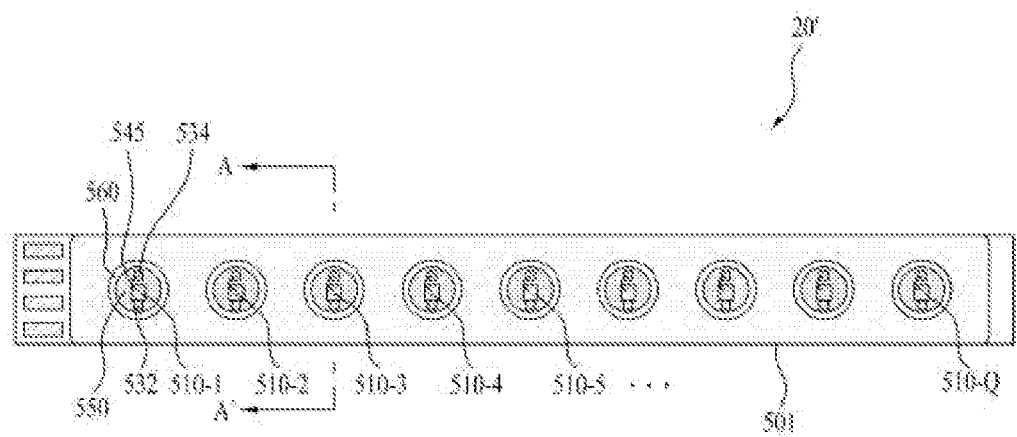
FIG. 10 is a view illustrating an example of a light emitting module illustrated in FIG. 1.
Figure 11:
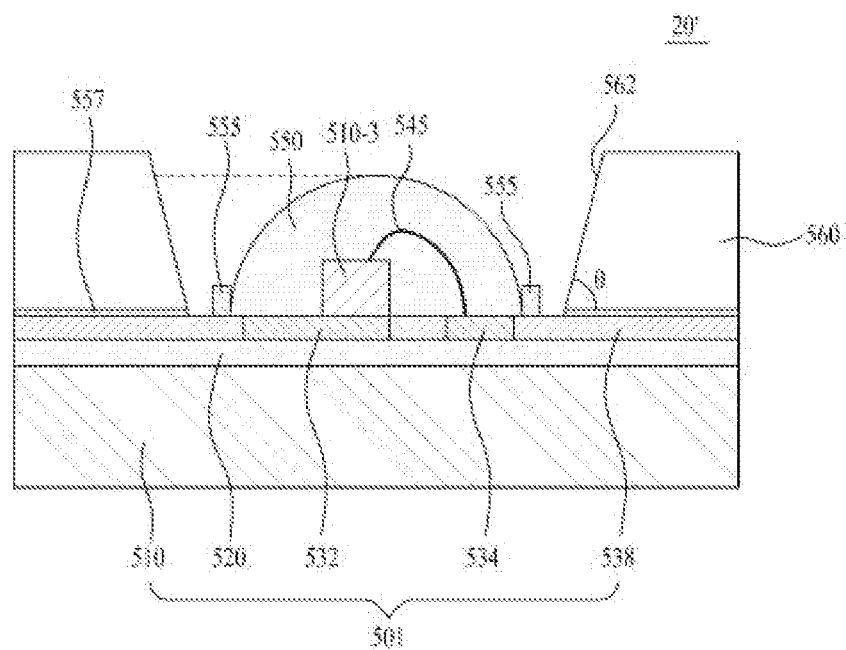
FIG. 11 is a sectional view taken along line A-A' of FIG. 10.

FIG. 10 is a view illustrating an example (i.e., a light emitting module 20') of the light emitting module 20 of FIG. 1. FIG. 11 is a sectional view taken along line A-A' of FIG. 10.

Referring to FIGS. 11 and 12, the light emitting module 20' includes a circuit substrate 501, a plurality of light emitting devices 510-1 to 510-Q where Q>1 (Q being a natural number), wires 545, molding units 150, molding fixing units 555, and reflective members 560.

The light emitting devices 510-1 to 510-Q where Q>1 (Q being a natural number) may be mounted on the circuit substrate 501 to be spaced apart from each other. The light emitting devices 510-1 to 510-Q where Q>1 (Q being a natural number) may be one example of the light sources 24-1 to 24-Q where Q>1 (Q being a natural number) illustrated in FIG. 1, e.g., light emitting diodes.

The circuit substrate 501 may be one example of the substrate 22 illustrated in FIG. 1 and include a heat dissipation layer 510, an insulating layer 520, a first metal layer 532, a second metal layer 534, and a solder resist layer 538.

The heat dissipation layer 510 may be formed of a thermally conductive material such as aluminum (Al) or the like.

The insulating layer 520 may be disposed on a surface of the heat dissipation layer 510, and the first and second metal layers 532 and 534 may be disposed on the insulating layer 520 to electrically separate each other. The insulating layer 520 insulates the heat dissipation layer 510 from the first and second metal layers 532 and 534.

The solder resist layer 538 may be disposed on the insulating layer 520 to be disposed between the first metal layer 532 and the second metal layer 534 and be formed of an insulating material to prevent short circuit between the first metal layer 532 and the second metal layer 534. The solder resist layer 538 may be formed of photo solder resist (PSR), in particular white PSR, but embodiments of the disclosure are not limited thereto.

The first and second metal layers 532 and 534 may include at least one of gold (Au), silver (Ag), and copper (Cu). The first and second metal layers 532 and 534 may be pattern-printed so that light emitting devices are mounted thereon.

The light emitting devices 510-1 to 510-Q where Q>1 (Q being a natural number) may be electrically connected to the first metal layer 532 and the second metal layer 534.

The molding units 550 may each independently surround and protect the light emitting devices 510-1 to 510-Q where Q>1 (Q being a natural number) and the wires 545 connected thereto. In addition, the molding units 550 may include phosphors, and the phosphors may change the wavelength of light emitted from the light emitting devices 510-1 to 510-Q where Q>1 (Q being a natural number).

Each molding unit 550 may have a dome shape to cover each of the light emitting devices 510-1 to 510-Q where Q>1 (Q being a natural number) and the corresponding wire 545. The molding units 550 may be formed of a resin or silicon, but embodiments of the disclosure are not limited thereto. Each molding unit 550 may surround each of a plurality of light emitting devices.

The molding fixing units 555 may be disposed on the circuit substrate 501 so as to contact an outer circumference of the molding unit 550 and fix an edge of the molding unit 550. The molding fixing units 555 may be disposed on the solder resist layer 538 so as to have a circular or oval sidewall shape to fix the edge of the molding unit 550.

The reflective member 560 may be disposed on the circuit substrate 501 so as to surround each molding unit 550 and reflect light emitted from the light emitting devices 510-1 to 510-Q where Q>1 (Q being a natural number). The reflective member 560 may have a reflective sidewall 562 extending upward from the circuit substrate 501 and inclined at a certain angle θ with respect to the circuit substrate 501.

The reflective member 560 may be formed of polyethylene terephthalate (PET) resin. The PET resin has very high reflectance, i.e., approximately 99%. The reflective member 560 may be fixed to the circuit substrate 501 by a fixing member 557.

The power supply 30 supplies power to the light emitting module 20 via a connector 11. For example, the power supply 30 may convert generally used alternating current (AC) power (e.g., 110V or 220V) into a direct current (DC) voltage (e.g., 3.3 V), which is an LED driving voltage, and supply the obtained voltage to the light emitting module 20.

The diffuser plate 40 may be disposed above the side plate 14 of the housing 10 and diffuse light emitted from the light sources 24-1 to 24-Q where Q>1 (Q being a natural number) through refraction and scattering. The diffuser plate 40 may be formed by adding a light diffuser to a synthetic resin.

The fixing member 50 may be coupled to a top end of the side plate 14 of the housing 10 by a coupling member (e.g., bolts, screws, or the like) and fix the diffuser plate 40 to the housing 10. The fixing member 50 may be formed of a lightweight material such as Al or plastic to add beauty to the exterior of the illuminating apparatus 100.

Figure 3:
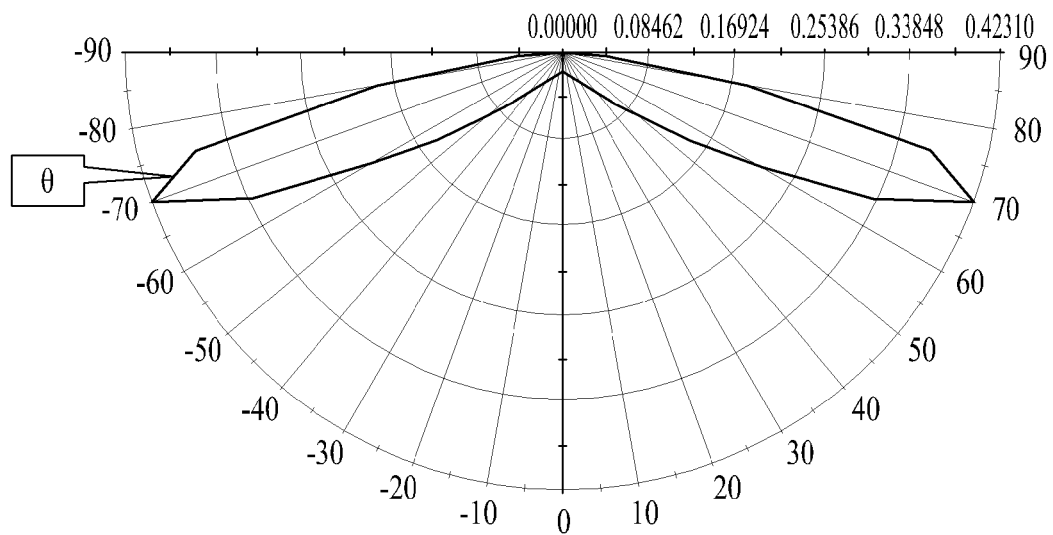
FIG. 3 is a graph showing luminous intensity characteristics of light sources illustrated in FIG. 1.

FIG. 3 is a graph showing luminous intensity characteristics of the light sources 24-1 to 24-Q where Q>1 (Q being a natural number) of FIG. 1.

Referring to FIG. 3, a max intensity angle of each of the light sources 24-1 to 24-Q where Q>1 (Q being a natural number) may be denoted as θ. When luminous intensities of the light sources 24-1 to 24-Q where Q>1 (Q being a natural number) are symmetrical with respect to 0°, a peak angle of each of the light sources 24-1 to 24-Q where Q>1 (Q being a natural number) may be defined as 2×θ.

The max intensity angle θ may be determined according to the luminous intensity characteristics of the light sources 24-1 to 24-Q where Q>1 (Q being a natural number). For example, the max intensity angle θ may be between 68° and 72°, but embodiments of the disclosure are not limited thereto.

Figure 4:
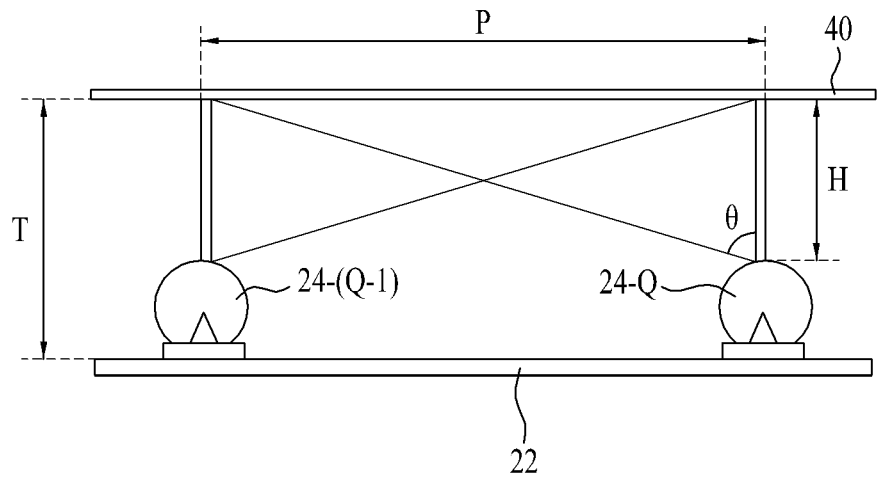
FIG. 4 is a view for explaining a relationship among a pitch between the light sources of FIG. 2, a distance between the light sources and a diffuser plate, and a max intensity angle.

FIG. 4 is a view for explaining a relationship among a pitch P between the light sources 24-1 to 24-Q of FIG. 2, a distance H between the light sources 24-1 to 24-Q and the diffuser plate 40, and the max intensity angle θ.

Referring to FIG. 4, the distance H between the light sources 24-1 to 24-Q and the diffuser plate 40 may be a value obtained by dividing the pitch P, which is a separation distance between adjacent light sources 24-(Q−1) and 24-Q, by $\tan(\theta)$ (i.e., $H=P/\tan(\theta)$).

To enhance luminance uniformity of light having been emitted from the light sources 24-1 to 24-Q and reaching the diffuser plate 40, a height T of the side plate 14 of the housing 10 may be represented by Equation 1 below. In this regard, the height T of the side plate 14 of the housing 10 may denote a distance between the lower plate 12 and the top end of the side plate 14 or a distance between the lower plate 12 and the diffuser plate 40.

$$T = \frac{\frac{X}{Q}}{\frac{\tan(\theta)}{A}} = \frac{P}{\frac{\tan(\theta)}{A}} = \frac{H}{A} \qquad \text{[Equation 1]}$$

In Equation 1, X may be a length of a long side (e.g., a width length) of the housing 10. For example, X may be a length of a long side of the lower plate 12 of the housing 10. Q may be the number of the light sources 24-1 to 24-Q where Q>1 (Q being a natural number). θ may be a max intensity angle θ of each of the light sources 24-1 to 24-Q where Q>1 (Q being a natural number). H may be a distance between the light sources 24-1 to 24-Q and the diffuser plate 40.

A OF the equation 1 may be a luminance compensation factor related to the size (e.g., diameter) of the light sources 24-1 to 24-Q where Q>1 (Q being a natural number). The luminance compensation factor A may vary according to the size of the light sources 24-1 to 24-Q so as to maintain the luminance uniformity of light having been emitted from the light sources 24-1 to 24-Q where Q>1 (Q being a natural number) and reaching the diffuser plate 40 to a certain level or greater and be set as shown in Equation 2 below. In Equation 2, D may be a diameter of the light sources 24-1 to 24-Q. The diameter of the light sources 24-1 to 24-Q may be the same as a unit of the size of an illuminating apparatus (e.g., a lighting apparatus).

$$A = -0.1 \times D + 1.6 \qquad \text{[Equation 2]}$$

In Equation 2, D may be the diameter of the light sources 24-1 to 24-Q where Q>1 (Q being a natural number).

P denotes the distance between adjacent light sources 24-(Q-1) and 24-Q and may be a value obtained by dividing the length X of the long side of the housing 10 by the number of the light sources 24-1 to 24-Q where Q>1 (Q being a natural number) (i.e., P=X/Q).

Figures 8, 9A:
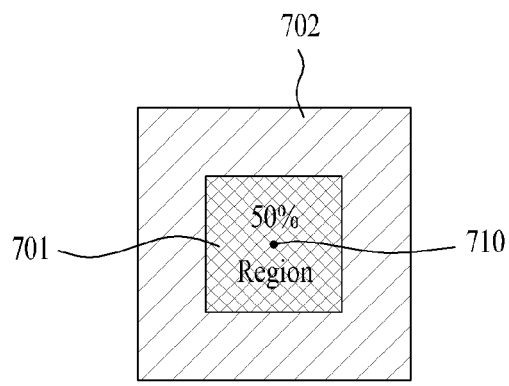
FIG. 8 is a table showing simulation results of luminance of the illuminating apparatus of FIG. 7.
FIG. 9A is a view illustrating luminance characteristics of a single light source.

FIG. 9A is a view illustrating luminance characteristics of a single light source 710.

Referring to FIG. 9A, a first region 701 may be a region with 50% of the maximum luminance value, and a second region 702 may be a region with 10% of the maximum luminance value.

Figure 9B:
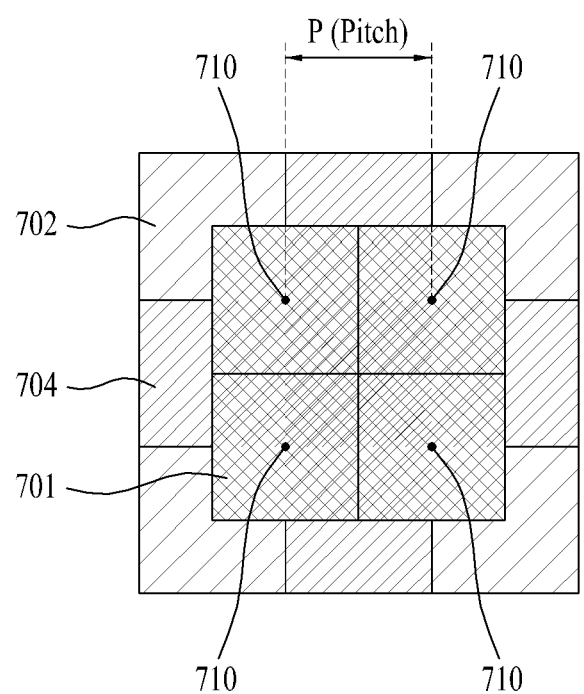
FIGS. 9B and 9C are views illustrating luminance characteristics of a plurality of light sources illustrated in FIG. 9A.
Figure 9C:
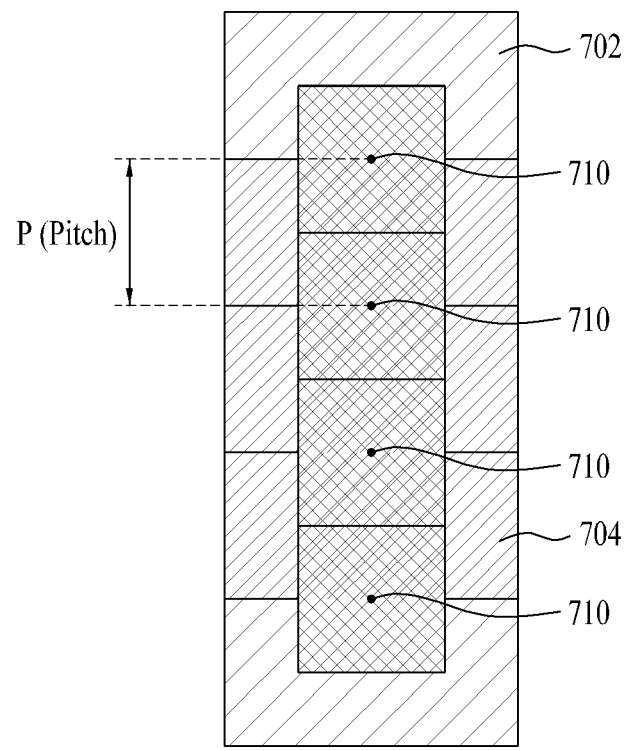

FIGS. 9B and 9C are views illustrating luminance characteristics of a plurality of light sources 710 illustrated in FIG. 9A.

Referring to FIGS. 9B and 9C, the luminance characteristics of the light sources 710 may be represented as having the first region 701, the second region 702, and a third region 704. In this regard, the third region 704 may be a region having a luminance value between luminance values of the first and second regions 701 and 702.

The luminance compensation factor A may be a value for compensating for uniformity of luminance of a portion of the region with 50% of the maximum luminance value, which is overlapped with a non-uniform region.

Figure 5A:
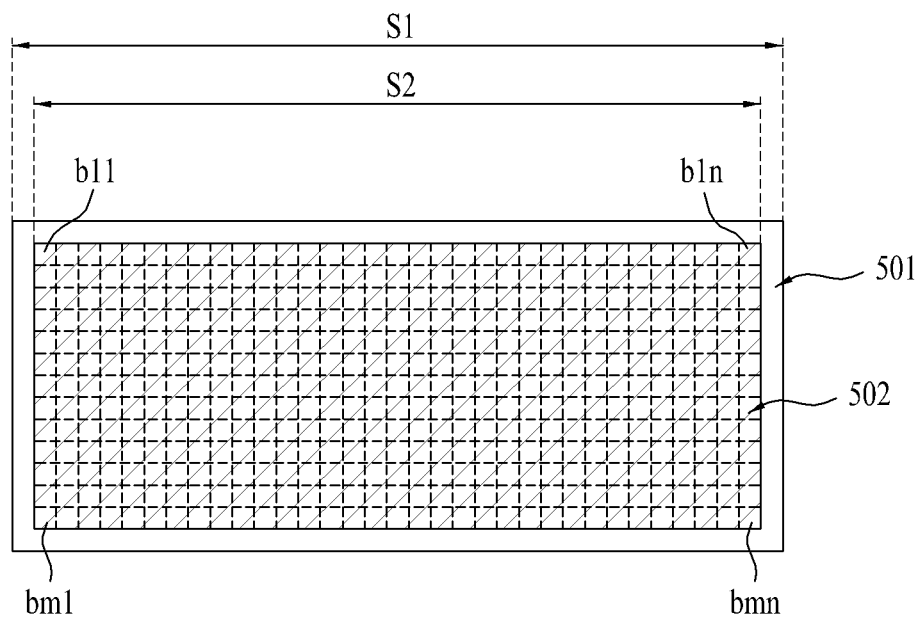
FIGS. 5A and 5B are views for explaining measurement of luminance of the illuminating apparatus of FIG. 1.
Figures 5B, 6:
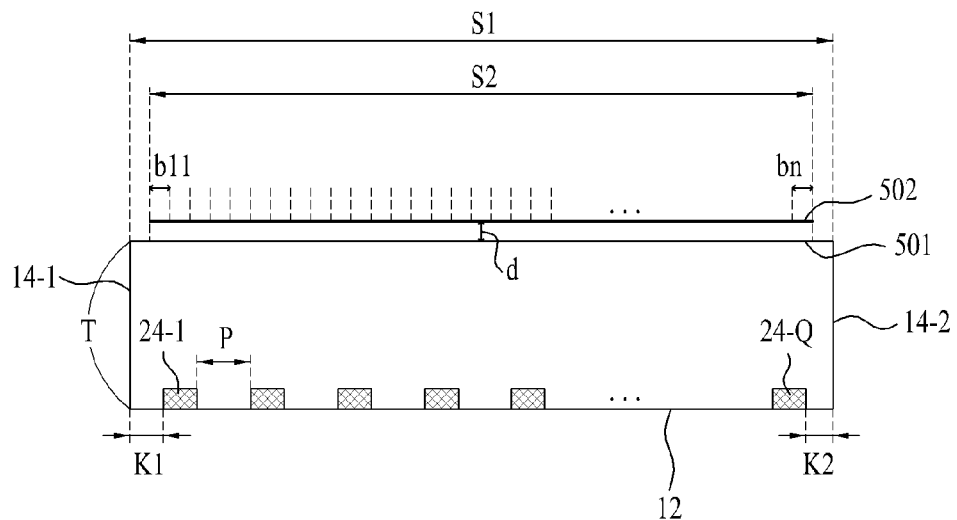
FIG. 6 is a table showing simulation results of the measurement of luminance illustrated in FIGS. 5A and 5B.

FIG. 5A is a plan view for explaining measurement of luminance of the illuminating apparatus 100 of FIG. 1. FIG. 5B is a sectional view for explaining the measurement of luminance illustrated in FIG. 5A.

Referring to FIGS. 5A and 5B, the light sources 24-1 to 24-Q where Q>1 (Q being a natural number) may be disposed on the substrate 22 the same distance from each other. For example, a first distance k1 between a first light source 24-1 and the first side surface 14-1 of the side plate 14 may be the same as a second distance k2 between the last light source 24-Q and the second side surface 14-2 of the side plate 14 (k1=k2).

The first light source 24-1 may be a light source closest to the first side surface 14-1, and the last light source 24-Q may be a light source closest to the second side surface 14-2.

A length Y of a short side of the housing 10 may be determined by the first distance k1 and the second distance k2. For example, the length Y of the short side of the housing 10 may be twice the first distance k1 (i.e., Y=2×k1). For example, the length Y of each of the first and second side surfaces 14-1 and 14-2 of the side plate 14 may be twice the first distance k1.

A detector 502 may be disposed above a light emitting surface 501 of the housing 10 and measure luminance of light emitted from the light emitting surface 501 of the housing 10. For example, the detector 502 may be disposed a certain distance (e.g., d=5 mm to 10 mm) apart from the light emitting surface 501.

In this regard, the light emitting surface 501 of the housing 10 may be a virtual plane contacting the top end of the side plate 14 of the housing 10. For example, the light emitting surface 501 may be parallel to a lower surface of the diffuser plate 40 and a virtual surface disposed on the same plane.

The detector 502 may measure luminance of light emitted from a region S2 (hereinafter referred to as a "second region") corresponding to 90% to 95% of an entire region S1 (hereinafter referred to as a "first region"). For example, the second region S2 may be the rest region of the light emitting surface 501 excluding an edge region of the light emitting surface 501.

The detector 502 may be an imaging camera, e.g., a charge-coupled device (CCD) camera. The second region S2 may be defined as a plurality of unit regions b11 to bnm where n,m>1 (n and m being natural numbers), and the detector 502 may detect image data corresponding to each of the unit regions b11 to bnm where n,m>1 (n and m being natural numbers). For example, width and height lengths of each of the unit regions b11 to bnm where n,m>1 (n and m being natural numbers) may be 1 mm.

Luminance data of each of the unit regions b11 to bnm where n,m>1 (n and m being natural numbers) may be acquired based on the detected image data.

FIG. 6 is a table showing simulation results of the measurement of luminance illustrated in FIGS. 5A and 5B.

Referring to FIG. 6, the length X of the long side of the housing 10, i.e., the width length X, may be 600 mm, and the length Y of the short side of the housing 10, i.e., the height length Y, may be twice the first distance k1. The pitch P may be determined according to the number Q of the light sources 24-1 to 24-Q.

The max intensity angle θ of each of the light sources 24-1 to 24-Q may be 70°.

The luminance compensation factor A may be determined according to the size (e.g., diameter) of the light sources 24-1 to 24-Q by Equation 2. And the height T of the side plate 14 of the housing 10 responding to the determined luminance compensation factor A may be determined by Equation 1.

FIG. 6 shows luminance simulation regions when A values are 1.4 and 1 and shows Min, Max, Avg, Min/Max, and Min/Avg of luminance data.

In this regard, Min may denote a minimum value of the luminance data corresponding to each of the unit regions b11 to bnm where n,m>1 (n and m being natural numbers). Max may denote a maximum value of the luminance data corresponding to each of the unit regions b11 to bnm where n,m>1 (n and m being natural numbers). Avg may denote an average of the luminance data corresponding to each of the unit regions b11 to bnm where n,m>1 (n and m being natural numbers).

A ratio of Min to Max (Min/Max) may be a standard for determining uniformity of the luminance of the illuminating apparatus 100. According to the simulation results, the ratio of Min to Max (Min/Max) of each of the unit regions b11 to bnm where n,m>1 (n and m being natural numbers) is greater than 0.7 and thus the illuminating apparatus 110 according to the embodiment may maintain or enhance luminance uniformity.

The luminance uniformity of the illuminating apparatus 100 may vary depending upon disposition of the light sources 24-1 to 24-Q (e.g., the number Q thereof and the pitch P), the max intensity angle θ of each of the light sources 24-1 to 24-Q, the height T of the side plate 14 of the housing 10, and the size of the light sources 24-1 to 24-Q.

The illuminating apparatus 100 according to the embodiment may have constant luminance uniformity or enhanced luminance uniformity by determining the luminance compensation factor A according to the size of light sources through experiments and determining the height T of the side plate 14 in accordance therewith.

Figure 7:
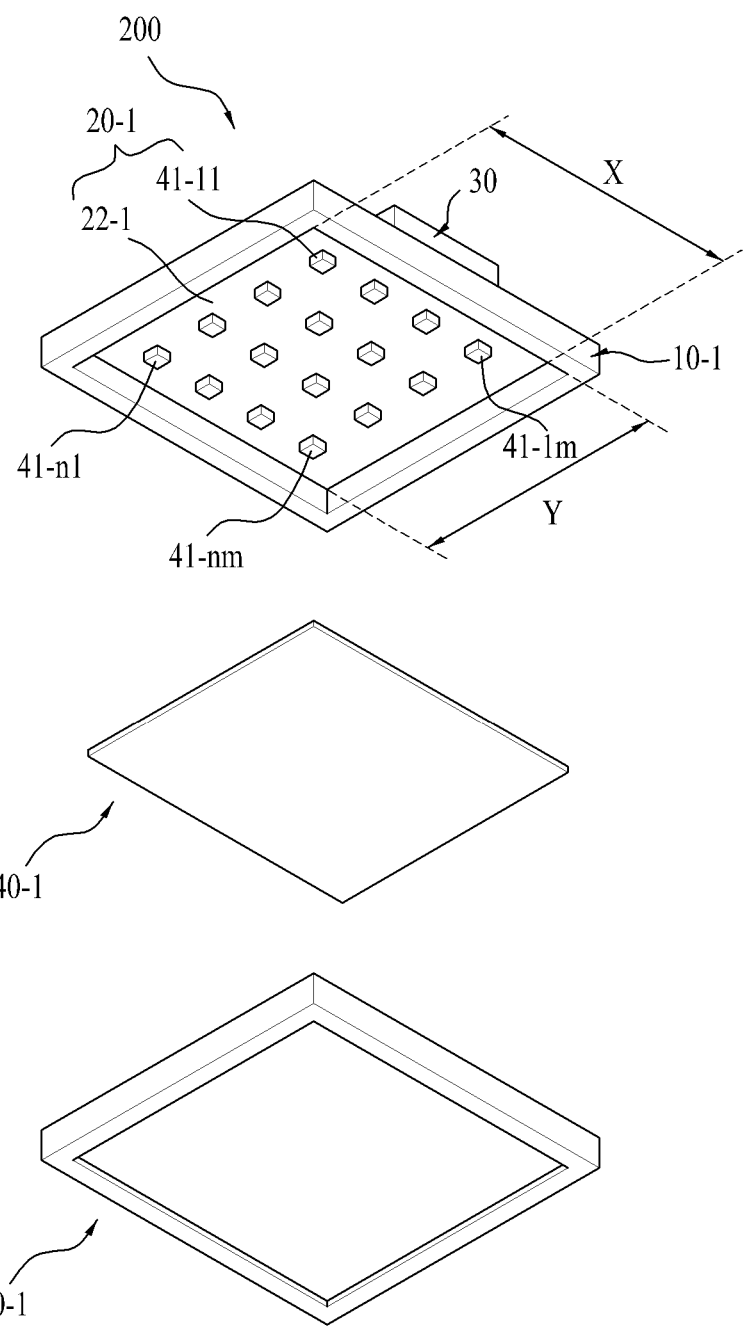
FIG. 7 is a view of an illuminating apparatus according to another embodiment.

FIG. 7 is a view of an illuminating apparatus 200 according to another embodiment. In FIG. 7, the same reference numerals as those of the illuminating apparatus 100 of FIG. 1 denote the same elements. Description of the same elements will be briefly provided or omitted herein.

Referring to FIG. 7, the illuminating apparatus 200 includes a housing 10-1, a light emitting module 20-1, the power supply 30, a diffuser plate 40-1, and a fixing member 50-1.

The illuminating apparatus 200 has a different structure than the illuminating apparatus 100 of FIG. 1 in that the housing 10-1 has a different shape than the housing 10 illustrated in FIG. 1.

A top view of the housing 10-1 may have a square shape in which a width length X and a height length Y are identical. For example, a lower plate 12-1 of the housing 10-1 may have a square shape in which the width length X and the height length Y are identical. In another embodiment, a side plate 14-1 of the housing 10-1 may have a square shape in which the width length X and the height length Y are identical.

The light emitting module 20-1, the power supply 30, the diffuser plate 40-1, and the fixing member 50-1 have different shapes and the same functions as those of the illuminating apparatus 100 of FIG. 1. That is, a substrate 22-1 of the light emitting module 20-1, arrangement of light sources 41-11 to 41-$nm$ where n,m>1 (n and m being natural numbers), and the diffuser plate 40-1 may have the same shape (i.e., a square shape) as that of the housing 10-1.

The light sources 41-11 to 41-$nm$ where n,m>1 (n and m being natural numbers) may be disposed in the form of a matrix including a plurality of columns (n)×a plurality of rows (m).

FIG. 8 is a table showing simulation results of luminance of the illuminating apparatus 200 of FIG. 7. The luminance of the illuminating apparatus 200 may be measured as described above with reference to FIGS. 5A and 5B.

Referring to FIG. 8, the width and height lengths X and Y of the housing 10-1 may be 300 mm, and a max intensity angle θ of each of the light sources 41-11 to 41-$nm$ where n,m>1 (n and m being natural numbers) may be 70°.

A transverse pitch P1 between the light sources 41-11 to 41-$nm$ where n, m>1 (n and m being natural numbers) may be determined according to the horizontal number m of the light sources 41-11 to 41-$nm$ where n, m>1 (n and m being natural numbers).

A longitudinal pitch P2 between the light sources 41-11 to 41-$nm$ where n, m>1 (n and m being natural numbers) may be determined according to the vertical number n of the light sources 41-11 to 41-$nm$ where n, m>1 (n and m being natural numbers).

The luminance compensation factor A may be determined by Equation 2 according to the size (e.g., diameter) of the light sources 41-11 to 41-$nm$. FIG. 8 shows luminance simulation results when A values are 1.4 and 1.

A height T of the side plate 14-1 of the housing 10-1 responding to the luminance compensation factor A determined by Equation 2 may be determined by Equation 1. For example, one of the transverse pitch P1 and the longitudinal pitch P2, having a greater value, may be applied to P of Equation 1.

From the simulation results, it can be confirmed that a ratio of Min to Max (Min/Max) is 0.7 or greater. Thus, the illuminating apparatus 200 may maintain or enhance luminance uniformity.

As is apparent from the above description, an illuminating apparatus may maintain and enhance luminance uniformity.

Embodiments provide an illuminating apparatus that may maintain and enhance luminance uniformity.

In one embodiment, an illuminating apparatus includes a housing including lower and side plates and a light emitting module including a substrate disposed on the lower plate and a plurality of light sources disposed on the substrate to be spaced apart from each other, wherein a height of the side plate is determined as a value obtained by dividing a separation distance between adjacent ones of the light sources by a value obtained by multiplying a tangent value of a max intensity angle of each of the light sources by a luminance compensation factor.

The luminance compensation factor may linearly decrease as a size of the light sources increases.

The luminance compensation factor may be a value obtained by multiplying a diameter of the light sources by −0.1 and adding 1.6.

The illuminating apparatus may further include a diffuser plate disposed above the side plate and diffusing light emitted from the light sources.

A top view of the housing may have a rectangular shape in which a width length is greater than a height length or a square shape in which a width length and a height length are identical.

Each of the lower and side plates may have a rectangular shape in which a width length is greater than a height length or a square shape in which a width length and a height length are identical.

The separation distance between the adjacent light sources may a value obtained by dividing the width length of the housing by the number of the light sources.

The height of the side plate may be a value obtained by dividing a distance between the light sources and the diffuser plate by the luminance compensation factor.

The light sources may be disposed on the substrate in a row. The light sources may be disposed on the substrate in a matrix form.

A groove part into which the substrate is inserted may be disposed at a contact region between the lower and side plates.

The substrate may be a printed circuit board (PCB), and each of the light sources may be a light emitting diode.

Each of the light sources may have a max intensity angle of 68° to 72°.

An angle between the lower and side plates may be 90° to less than 180°.

The side plate may include first and second side surfaces facing each other and third and fourth side surfaces facing each other, wherein lengths of the first and second side surfaces are smaller than those of the third and fourth side surfaces, and a first distance between a first light source and the first side surface is identical to a second distance between a second light source and the second side surface, the first light source being a light source closest to the first side surface, and the second light source being a light source closest to the second side surface.

The length of each of the first and second side surfaces of the side plate may be twice the first distance.

In another embodiment, an illuminating apparatus includes a housing including lower and side plates, a light emitting module including a substrate disposed on the lower plate and a plurality of light sources disposed on the substrate to be spaced apart from each other, and a diffuser plate disposed above the side plate and diffusing light emitted from the light sources, wherein a height of the side plate is determined as a value obtained by dividing a separation distance between adjacent ones of the light sources by a value obtained by multiplying a tangent value of a max intensity angle of each of the light sources by a luminance compensation factor, the luminance compensation factor being a value obtained by multiplying a diameter of the light sources by −0.1 and adding 1.6.

The height of the side plate may be a value obtained by dividing a distance between the light sources and the diffuser plate by the luminance compensation factor.

The light sources may be disposed on the substrate in a row or in a matrix form.

The separation distance between adjacent ones of the light sources may be a value obtained by dividing a width length of the housing by the number of the light sources.

The features, structures, effects, and the like described in the embodiments are included in at least one embodiment of the disclosure and are not necessarily limited to one embodiment. Furthermore, the features, structures, effects, and the like provided in each embodiment may be combined or modified in other embodiments by those skilled in the art to which the embodiments pertain. Therefore, contents related to the combination and modification should be construed to be included in the scope of the disclosure.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An illuminating apparatus comprising:
a housing including a lower plate and a side plate; and
a light emitting module including a substrate disposed on the lower plate and a plurality of light sources disposed on the substrate spaced apart from each other, wherein a height of the side plate is a value obtained by dividing a separation distance between adjacent light sources by a value obtained by multiplying a tangent value of a max intensity angle of each of the light sources by a luminance compensation factor A which is related to a size of each of the light sources, wherein A=−0.1×D+1.6, and D is a diameter of each of the light sources, and wherein the height of the side plate is a distance between the lower plate and a top end of the side plate and the max intensity angle is an angle of max luminous intensity with respect to 0° in a graph showing luminous intensity characteristics of the light sources, and the max intensity angle of each of the light sources is 68° to 72°,
wherein the luminance compensation factor A is a value for compensating for uniformity of luminance of a region with 50% of the maximum luminance value,
wherein the separation distance is one of a transverse pitch and a longitudinal pitch between the adjacent light sources having a greater value,
wherein the side plate includes first and second side surfaces facing each other and third and fourth side surfaces facing each other, wherein lengths of the first and second side surfaces are smaller than those of the third and fourth side surfaces, and a first distance between a first light source and the first side surface is identical to a second distance between a second light source and the second side surface, the first light source being a light source closest to the first side surface, and the second light source being a light source closest to the second side surface, and
wherein the length of each of the first and second side surfaces of the side plate is twice the first distance.

2. The illuminating apparatus according to claim 1, further comprising a diffuser plate disposed above the side plate and diffusing light emitted from the light sources.

3. The illuminating apparatus according to claim 2, further comprising a fixing member coupled to a top end of the side plate of the housing and fixing the diffuser plate to the housing and coupled to a top end of the side plate of the housing.

4. The illuminating apparatus according to claim 1, wherein a top view of the housing has a rectangular shape in which a width length is greater than a height length.

5. The illuminating apparatus according to claim 4, wherein the separation distance between the adjacent light sources is a value obtained by dividing the width length of the housing by the number of the light sources.

6. The illuminating apparatus according to claim 1, wherein each of the lower and side plates has a rectangular shape in which a width length is greater than a height length.

7. The illuminating apparatus according to claim 1, wherein the light sources are disposed on the substrate in a row.

8. The illuminating apparatus according to claim 1, wherein the light sources are disposed on the substrate in a matrix form.

9. The illuminating apparatus according to claim 1, wherein a groove part into which the substrate is inserted is disposed at a contact region between the lower plate and the side plate.

10. The illuminating apparatus according to claim 1, wherein the substrate is a printed circuit board and each of the light sources is a light emitting diode.

11. The illuminating apparatus according to claim 1, wherein the light emitting module further comprises:
   molding units independently surrounding each of the light sources;
   molding fixing units disposed on the substrate, wherein each of the molding fixing units contacts an outer circumference of corresponding one of the molding units; and
   a reflective member disposed on the substrate and having openings exposed the molding units and the molding fixing units,
   wherein each of the openings has a reflective sidewall and the reflective sidewall is spaced away from the molding fixing units.

12. The illuminating apparatus according to claim 11, wherein a highest point of each of the molding units is located under a top surface of the reflective member with respect to a top surface of the substrate.

13. The illuminating apparatus according to claim 1, further comprising a power supply supplying power to the light emitting module.

14. The illuminating apparatus according to claim 1, wherein as the diameter of each of the light sources increases, the height of the side plate increases based on the luminance compensation factor A.

15. An illuminating apparatus comprising:
   a housing including lower and side plates;
   a light emitting module including a substrate disposed on the lower plate and a plurality of light sources disposed on the substrate spaced apart from each other; and
   a diffuser plate disposed above the side plate and diffusing light emitted from the light sources, wherein a height of the side plate is a value obtained by dividing a separation distance between the light sources and the diffuser plate by a luminance compensation factor A which is related to a size of each of the light sources, wherein $A=-0.1 \times D+1.6$, and D is a diameter each of the light sources, and wherein the height of the side plate is a distance between the lower plate and a top end of the side plate and the max intensity angle is an angle of max luminous intensity with respect to 0° in a graph showing luminous intensity characteristics of the light sources and the max intensity angle of each of the light sources is 68° to 72°, and
   wherein the luminance compensation factor A is a value for compensating for uniformity of luminance of a region with 50% of the maximum luminance value,
   wherein the separation distance is one of a transverse pitch and a longitudinal pitch between the adjacent light sources having a greater value,
   wherein the side plate includes first and second side surfaces facing each other and third and fourth side surfaces facing each other, wherein lengths of the first and second side surfaces are smaller than those of the third and fourth side surfaces, and a first distance between a first light source and the first side surface is identical to a second distance between a second light source and the second side surface, the first light source being a light source closest to the first side surface, and the second light source being a light source closest to the second side surface, and
   wherein the length of each of the first and second side surfaces of the side plate is twice the first distance.

16. The illuminating apparatus according to claim 15, wherein the light sources are disposed on the substrate in a row or in a matrix form.

17. The illuminating apparatus according to claim 15, wherein the separation distance between adjacent ones of the light sources is a value obtained by dividing a width length of the housing by the number of the light sources.

18. The illuminating apparatus according to claim 15, wherein the light emitting module further comprises:
   molding units independently surrounding each of the light sources;
   molding fixing units disposed on the substrate, wherein each of the molding fixing unit contacts an outer circumference of corresponding one of the molding units; and
   a reflective member disposed on the substrate and having openings exposed the molding units and the molding fixing units,
   wherein each of the openings has a reflective sidewall and the reflective sidewall is spaced away from the molding fixing units.

19. The illuminating apparatus according to claim 18, wherein a highest point of each of the molding units is located under a top surface of the reflective member with respect to a top surface of the substrate.

20. The illuminating apparatus according to claim 11, wherein the substrate includes:
   a heat dissipation layer;
   an insulating layer disposed on the heat dissipation layer;
   first and second metal layers disposed on the insulating layer and electrically separated each other; and
   a solder resist layer disposed on the insulating layer and disposed between the first and second metal layers.

* * * * *